United States Patent
Seynaeve et al.

(10) Patent No.: US 7,800,910 B2
(45) Date of Patent: Sep. 21, 2010

(54) ELECTRONIC APPLIANCE PROVIDED WITH A COOLING ASSEMBLY FOR COOLING A CONSUMER INSERTABLE MODULE, AND COOLING ASSEMBLY FOR COOLING SUCH MODULE

(75) Inventors: Dirck Seynaeve, Bruges (BE); Gratien Alfons Marie Banckaert, Bruges (BE); Danny Arnoldus Julomain Delacroix, Bruges (BE)

(73) Assignee: Koninklijke Philips Electronics N V, Eindhoven (NL)

( * ) Notice: Subject to any disclaimer, the term of this patent is extended or adjusted under 35 U.S.C. 154(b) by 250 days.

(21) Appl. No.: 11/915,742

(22) PCT Filed: May 31, 2006

(86) PCT No.: PCT/IB2006/051734
§ 371 (c)(1),
(2), (4) Date: Nov. 28, 2007

(87) PCT Pub. No.: WO2006/129281
PCT Pub. Date: Dec. 7, 2006

(65) Prior Publication Data
US 2009/0279261 A1    Nov. 12, 2009

(30) Foreign Application Priority Data
Jun. 2, 2005    (EP) .................................. 05104804

(51) Int. Cl.
*H05K 7/20* (2006.01)
*F28F 7/00* (2006.01)

(52) U.S. Cl. .................. 361/715; 361/679.54; 361/690; 361/704; 361/707; 165/80.2; 165/185

(58) Field of Classification Search ............ 361/679.46, 361/679.54, 690, 704, 707, 715, 737, 741–742, 361/756, 800, 809, 816, 818; 165/80.2, 185; 174/520, 547–548
See application file for complete search history.

(56) References Cited

U.S. PATENT DOCUMENTS
5,414,592 A    5/1995    Stout (Continued)

FOREIGN PATENT DOCUMENTS
EP    0580412 A1    1/1994

OTHER PUBLICATIONS

B. Baumbaugh et al., "Thermal Design and Tests for the CMS HCAL Readout Box", Nuclear Science Symposium Conference record, Oct. 2000 IEEE, vol. 2, pp. 9/259-9/263.

*Primary Examiner*—Jayprakash N Gandhi
*Assistant Examiner*—Robert J Hoffberg

(57) ABSTRACT

The invention relates to an electronic appliance (1), provided with a cooling assembly (10) for cooling a module (4) that during use can be inserted in the appliance (1) by a consumer. The cooling assembly (10) comprises a cooling body (12) and sliding means (8A, 8B). The sliding means are arranged to engage the module with a low frictional contact surface, so as to facilitate insertion of the module. The sliding means are furthermore arranged to form a thermally conductive bridge between the module and the cooling body. At least one of the cooling body and the sliding means is resiliently deflectable, thereby allowing the sliding means to be pushed out of the way by the module, when this module is being inserted or removed.

14 Claims, 3 Drawing Sheets

U.S. PATENT DOCUMENTS

| | | | |
|---|---|---|---|
| 5,473,506 A * | 12/1995 | Kikinis | 361/688 |
| 5,640,302 A * | 6/1997 | Kikinis | 361/679.41 |
| 5,812,374 A * | 9/1998 | Shuff | 361/704 |
| 6,062,299 A * | 5/2000 | Choo et al. | 165/46 |
| 6,191,943 B1 | 2/2001 | Tracy | |
| 6,230,788 B1 * | 5/2001 | Choo et al. | 165/46 |
| 6,882,533 B2 | 4/2005 | Bash | |
| 7,001,217 B2 * | 2/2006 | Bright et al. | 439/607.2 |
| 7,085,131 B2 * | 8/2006 | Peng et al. | 361/679.32 |
| 7,133,285 B2 * | 11/2006 | Nishimura | 361/715 |
| 7,448,921 B2 * | 11/2008 | Kim et al. | 439/744 |
| 2002/0114140 A1 | 8/2002 | Bash | |
| 2003/0161108 A1 | 8/2003 | Bright | |
| 2003/0169581 A1 * | 9/2003 | Bright et al. | 361/816 |
| 2004/0080907 A1 | 4/2004 | Belady | |
| 2005/0018401 A1 | 1/2005 | Stocken | |
| 2005/0161195 A1 * | 7/2005 | Hein | 165/80.3 |
| 2005/0190535 A1 * | 9/2005 | Peng et al. | 361/685 |
| 2006/0077776 A1 * | 4/2006 | Matsushima et al. | 369/30.27 |
| 2006/0126306 A1 * | 6/2006 | Blair et al. | 361/716 |
| 2007/0054971 A1 * | 3/2007 | Hiroshige et al. | 521/60 |

* cited by examiner

ELECTRONIC APPLIANCE PROVIDED WITH A COOLING ASSEMBLY FOR COOLING A CONSUMER INSERTABLE MODULE, AND COOLING ASSEMBLY FOR COOLING SUCH MODULE

The invention relates to an electronic consumer appliance, configured to receive a consumer insertable module, such as a POD-card, a memory stick, an access module or the like.

The invention furthermore relates to a cooling assembly for cooling such inserted module.

Appliances of the abovementioned type are well known. One commonly encountered problem with such appliances is that the temperature of the inserted module may become quite high, due to electronic components inside the appliance generating considerable amounts of heat. Such high module temperature may cause failure to the module and form a hazard to a consumer when removing the module from the appliance. Therefore, known appliances are equipped with some cooling arrangement, to keep the module temperature within acceptable boundaries.

One known cooling arrangement utilizes a fan to blow air along the inserted module, thereby allowing heat to be dissipated through convection. Although such arrangement may function properly, it does suffer from some considerable drawbacks. For one, fans generally constitute relatively complex and expensive components, which are prone to failure and hence compromise the field call rate (FCR) of the appliance. A further drawback is that fans generally produce noise. Also, for proper performance, fans require sufficient (air) space, which often may not be available due to stringent size constraints.

From U.S. Pat. No. 6,882,533 a cooling assembly is known which utilizes a cooling body that can be brought into contact with an inserted module (in particularly a printed circuit board), to dissipate heat from said module to the cooling body through thermal conduction. This cooling assembly suffers from a number of drawbacks, mainly caused by the fact that the module is insertable. To allow the module to be inserted and removed unobstructed, the known cooling assembly is equipped with a rather complex guiding system, featuring actuating plates, cams and cam followers, to move the cooling body in and out of contact with the module. Such movable mechanical parts render the assembly complex, costly and little robust.

It is therefore an object of the present invention to provide an appliance of the aforementioned type with a cooling assembly, wherein at least a number of the drawbacks of the known cooling assemblies is avoided. More particular, it is an object of the invention to provide an electronic appliance with a cooling assembly that allows for good cooling and easy insertion of a module, yet is of simple, robust design. To that end, an appliance according to the invention is characterized by the features of claim 1.

By providing the appliance with sliding means, to engage the module and couple this module thermally conductively to a cooling body, and by making at least one of said cooling body and said sliding means resiliently deflectable, the sliding means can be readily pushed aside by the module, upon insertion thereof. The sliding means is preferably provided with a smooth, low friction contact surface, thereby facilitating insertion and removal of the module. Moreover, thanks to the resilient deflection, the sliding means will be pressed against the module, thereby effecting good thermal contact and good thermal conductivity. Hence, with a cooling assembly according to the invention, good cooling and easy insertion and removal of the module can be attained, without the need for complicated movable mechanical parts. Indeed, according to one aspect of the invention, the sliding means and/or cooling body can be mounted stationary in the appliance, for instance by attaching said components to a chassis of the appliance. This results in a simple, robust cooling assembly.

According to one aspect of the invention, the cooling body can be made of compressible material, in particular thermally conductive foam. Foam can be easily compressed and hence can readily give way to a module that is being inserted. Moreover, the compression will ensure good contact between the cooling body, the sliding means and the module, thereby allowing good heat transfer from the module to the cooling body. Furthermore, foam has good conformability and can therefore establish good physical contact over large contacting areas, even when said contact areas contain irregularities or thickness variations. This too will enhance the heat transfer. Also, the foam body will be little sensitive to assembly errors, since such errors can be readily compensated for thanks to said conformability of the foam. Therefore, the body can be readily assembled, for instance by adhering the body to the chassis by means of adhesive. Furthermore, a cooling body made of foam is light, robust and will require relatively little space.

According to another aspect of the invention, the sliding means may comprise a flexible layer of thermally conductive material, with a low friction coefficient or a low friction surface. Such layer may for instance comprise a metal or plastic sheet, provided with a smoothened, e.g. polished surface. This layer can be arranged so as to cover a side of the cooling body that faces the module, thereby forming a smooth sliding surface for the module.

According to another aspect of the invention the sliding means can comprise one or more spring members, for instance plate springs, arranged to be resiliently deflected upon insertion of a module, and to resiliently bounce back, upon removal of said module. With such embodiment, the cooling body itself does not need to be compressible. It may be mounted on the sliding means and stay clear from other parts of the component, thereby acting as a heat sink, dissipating heat through radiation and/or convection. Alternatively, the cooling body may be brought into contact with the chassis (or some other heat conductive part) upon deflection of the spring member. In such case, the cooling body can act as a thermal bridge, allowing heat to be dissipated to said chassis via conduction. Alternatively, the cooling body may be adhered to the chassis or some other appliance part, and lie clear from the sliding means when no module is inserted. Insertion of a module may then cause the sliding means to deflect towards the cooling body, so as to establish thermal (conductive) contact therewith. Of course, other variations are possible, wherein for instance both the cooling body and the sliding means are resiliently deflectable, or an embodiment wherein the cooling body is in contact with the sliding means as well as the chassis, when no module is inserted.

According to another aspect of the invention, the sliding means may be designed so as to close off an insertion opening for the module, when no module is inserted. This may help to avoid EMC related problems, arising from the appliance having an insertion opening.

Further advantageous embodiments of an appliance and a cooling assembly according to the present invention are set forth in the dependent claims.

To explain the invention, exemplary embodiments thereof will hereinafter be described with reference to the accompanying drawings, wherein.

Figure 1:
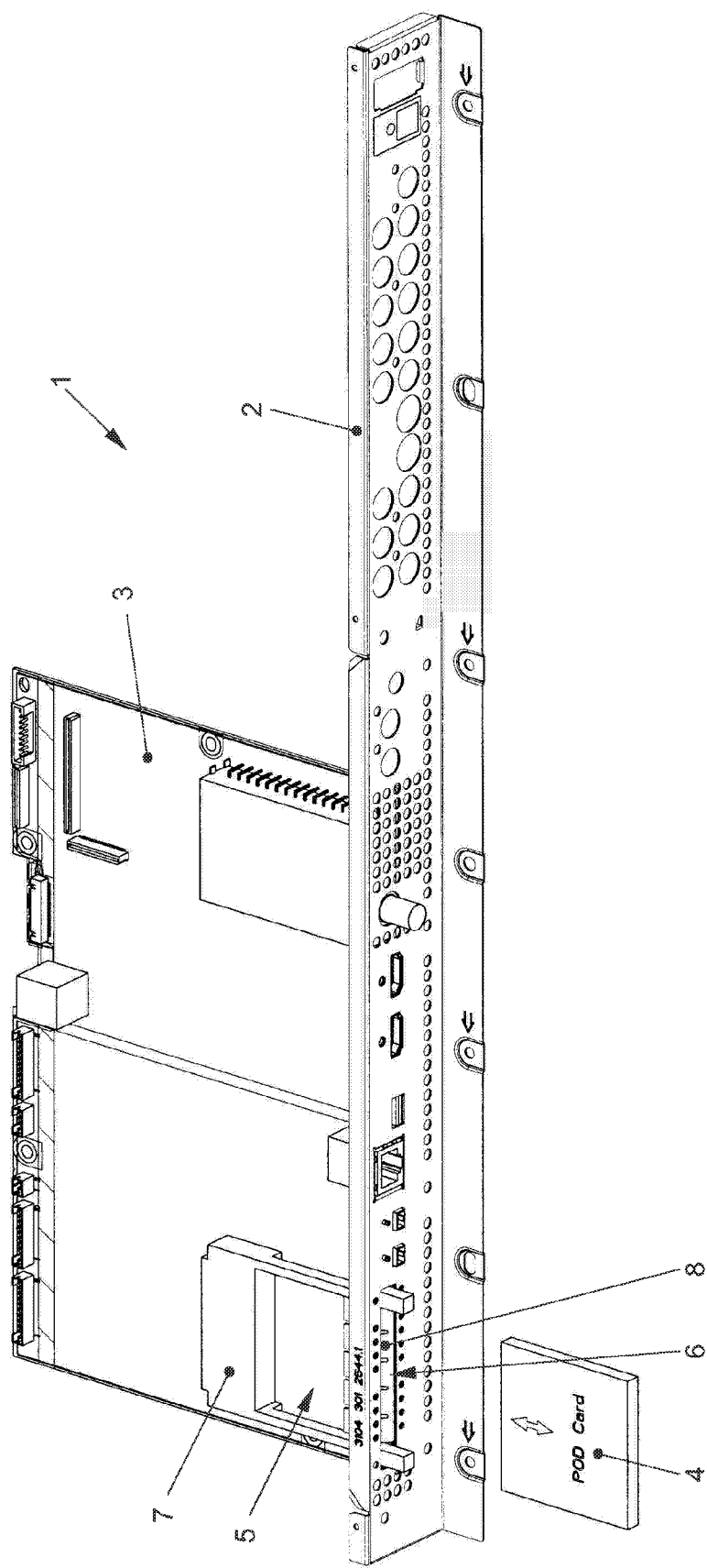
FIG. 1 shows, in perspective view, part of an electronic consumer appliance according to the invention, configured to receive an insertable module.
Figure 2A:
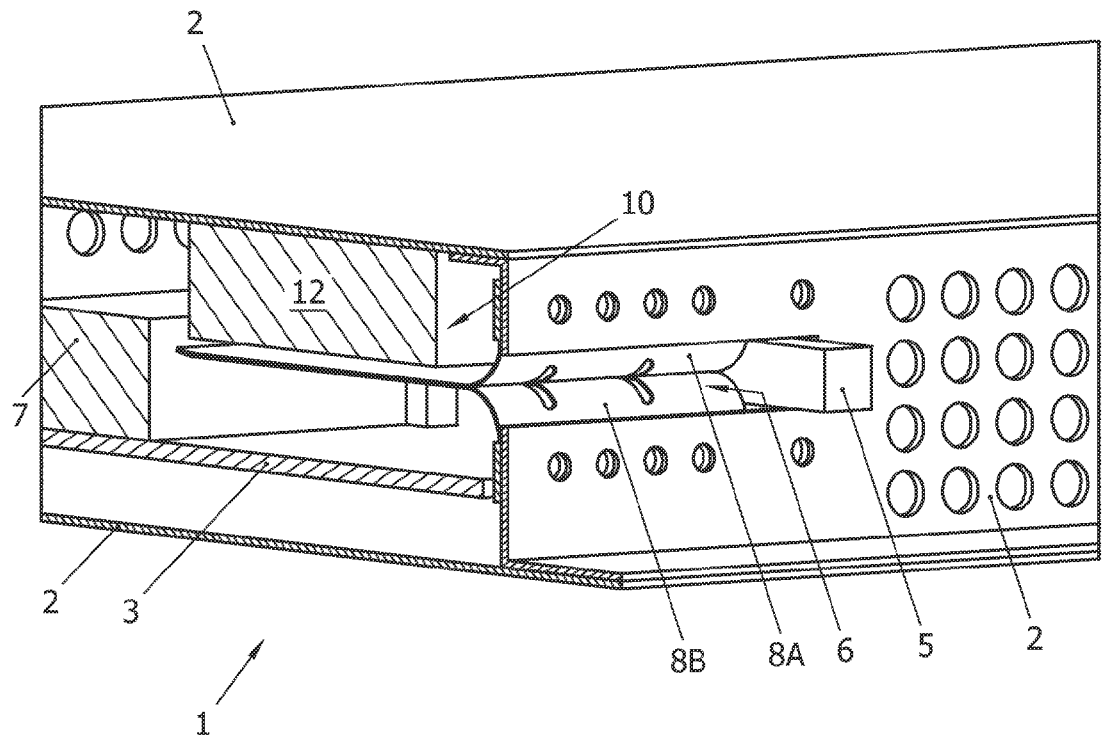
FIG. 2A shows, in frontal perspective view, the appliance of FIG. 1, provided with a cooling assembly according to the invention.
Figure 2B:
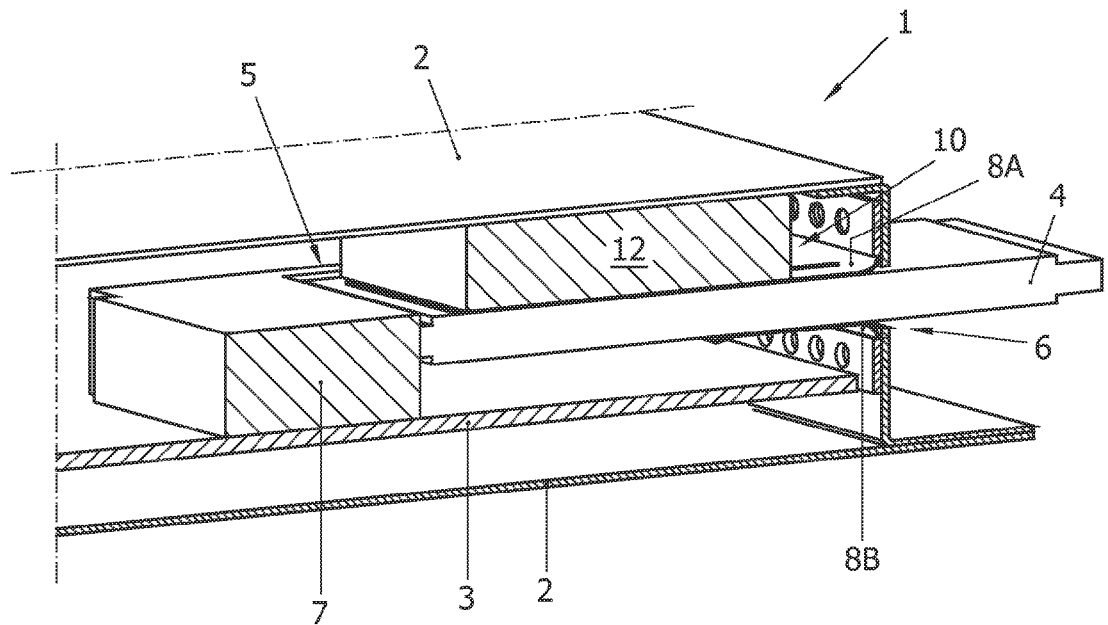
FIG. 2B shows the appliance of FIG. 2A, in side view, with inserted module.

FIGS. 1 and 2 show part of an electronic appliance 1, comprising a housing or chassis 2, a printed circuit board (PCB) 3, which is mounted in said chassis 2, a plug-in arrangement 5 for receiving a consumer insertable module 4, and a cooling assembly 10 (see FIGS. 2A,B) for cooling such module 4, once inserted. In this example, the electronic appliance 1 can for instance be integrated in a television set or be part of a set-top box, for digital television. In such case the plug-in module 4 may be a POD (Point Of Deployment)-card or a PCMCIA- or CI-(common interface)-card. Of course, many other applications are possible. The appliance 1 can for instance form part of a computer, in which case the plug-in module 4 may be a memory module, an access module, a communication module, a printed circuit board, or the like.

The plug-in arrangement 5 comprises an insert opening 6 for inserting a module 4, and a connector 7 for connecting the inserted module 4 to the PCB 3. Furthermore, sliding means 8 are provided, comprising two plate springs 8A,B, cantilevered from an upper and lower edge of the insert opening 6 and abutting each other when no module 4 is inside, thereby closing off the insert opening 6. This may avoid or minimize EMC problems. The plate springs 8A,B can be resiliently pushed apart when a module 4 is inserted via insert opening 6, and will then guide and support the module 4 to its desired position. In this position, the module 4 extends substantially parallel to and at a relatively short distance above the PCB 3, as perhaps best seen in FIG. 2B. Of course, in alternative embodiments, the plug-in arrangement 5 could be rotated over 90 degrees wherein the PCB 3 and module 4 extend substantially vertically, or rotated over 180 degrees, wherein the PCB 3 extends above the module 4.

The cooling assembly 10 comprises a cooling body 12 and the aforementioned sliding means 8, both made of a thermally conductive material. The sliding means 8 can for instance be made of metal, in particular spring steel. The cooling body 12 is preferably made of a compressible material, in particular thermally conductive foam, such as for instance a soft silicon elastomer filled with ceramic particles. The cooling body 12 is mounted between the sliding means 8 and the chassis 2, and in the case where the body 12 is compressible, preferably dimensioned so as to physically contact both parts 2,8 when no module 4 is inserted in the plug-in arrangement 5. Alternatively (not shown), the cooling body 12 can be mounted in abutting relation with the sliding means 8 and stay clear from the housing 2 or, conversely, can be mounted to the housing 2 and stay clear from the sliding means 8. In the latter case (and preferably in the former case as well) the sliding means 8 should be configured such that in deflected condition (upon insertion of a module) these sliding means 8 can bridge the clearance and establish physical contact with the cooling body 12. The cooling body 12 in turn may physically contact the housing 2 or some other conductive component, such as a heat sink (not shown). Thus, a thermally conductive bridge is formed, allowing heat to be transferred from the module 4 to the sliding means 8, from these sliding means 8 to the cooling body 12 and from there to the chassis 2 or another conductive part. Alternatively or additionally, heat may be dissipated from the cooling body 12 to the ambient air, through convection and/or radiation. In this way, the temperature $T_m$ of the module 4 can be kept below a predetermined value, thereby preventing the module 4 from becoming damaged and preventing a customer from burning his fingers when removing the module 4.

It will be appreciated that the sliding means 8 fulfill a double function. They allow for easy insertion and removal of the module 4, thanks to their smooth contacting surface and their ability to deflect away from the insertion direction, thereby clearing the passage for the module 4. The sliding means 8 furthermore establish the thermally conductive connection between the inserted module 4 and the cooling body 12, wherein the resilience of the sliding means 8 helps to maintain these means in close thermal contact with the module 4. Thanks to abovementioned functionality, no complicated moving mechanical parts are needed, such as known from the prior art. Instead, the sliding means 8, and optionally the cooling body 12, can be mounted stationary, to a static part of the appliance 1.

Figure 3A:
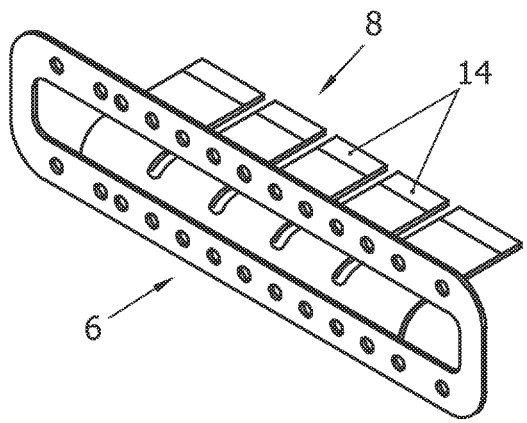
FIG. 3A shows a first embodiment of sliding means according to the invention.
Figure 3B:
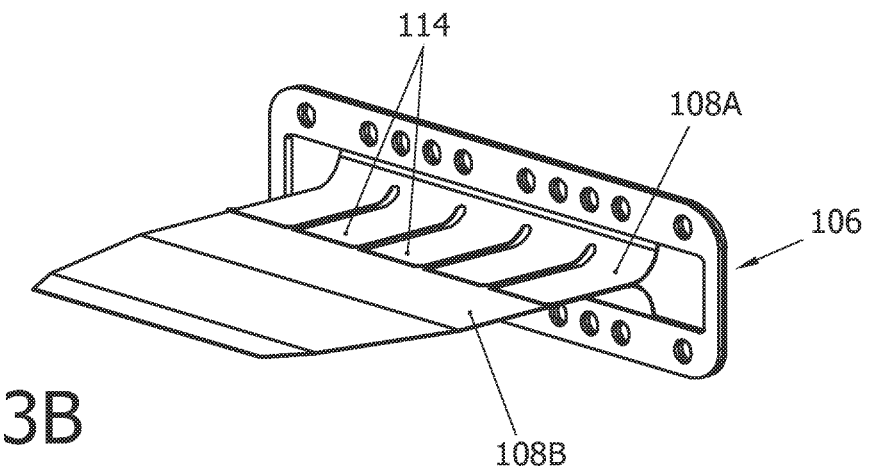
FIG. 3B shows an alternative embodiment of sliding means according to the invention.

The sliding means 8 may be configured as shown in FIG. 3A, that is as resilient fingers 14, arranged to resiliently clamp the module 4, at opposite sides. Alternatively, the fingers 14 may be interconnected so as to form a single plate-spring member, as shown in FIG. 3B. The use of separate fingers 14 is particularly advantageous when the module 4 features an uneven contact surface, small thickness variations, or the like. In such case, the fingers 14 may adapt their individual positions so as to achieve maximum abutting contact with said module 4. Of course, intermediate forms are possible, wherein the spring members comprise for instance fingers 14 which are partly interconnected and partly separated from each other. Furthermore, combinations are possible, of which one exemplary combination 106 is shown in FIG. 3B. In this example, the upper sliding means 108A comprise separate spring fingers 114, whereas the lower sliding means 108B comprises a single abutting plate. In the illustrated embodiments, the sliding means 8, 108 are configured to resiliently clamp the module 4 from opposite sides. Of course, in alternative embodiments, the sliding means 8B, 108B extending at a bottom side of the module 4, i.e. the side facing away from the cooling body 12, may be rigid, leaving all deflection to be provided by the upper sliding means 8A, 108A.

In all instances, the contacting surface of the sliding means 8 is preferably as large as possible, so as to allow for large contact areas with the module 4 and the cooling body 12, and consequently a large heat transfer capacity of the cooling assembly 10.

Figure 3C:
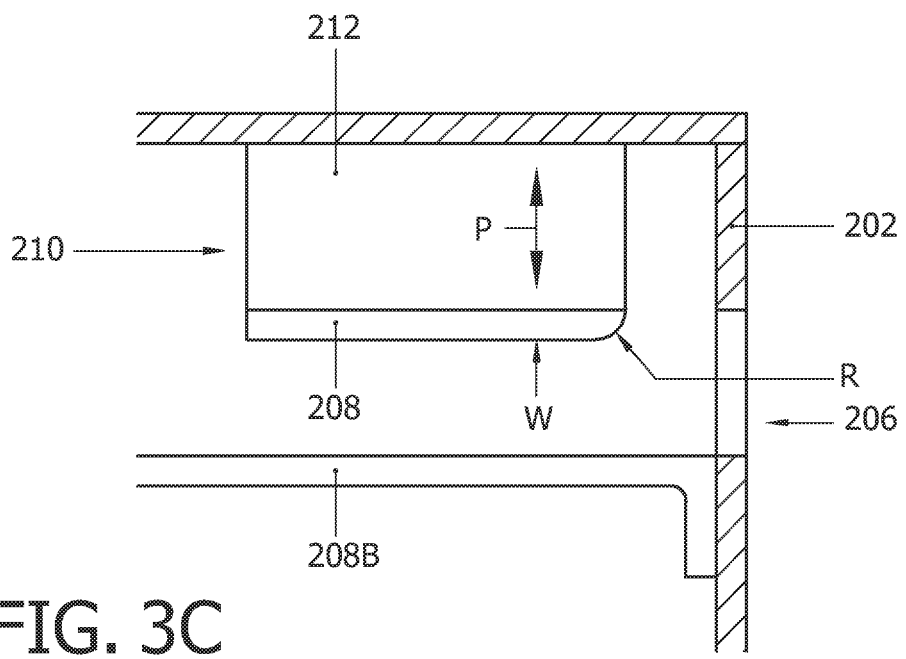
FIG. 3C shows an alternative embodiment of a cooling assembly according to the invention.

FIG. 3C shows yet another embodiment of a cooling assembly 210 according to the invention, wherein the sliding means 208 are configured as a layer of thermally conductive material, having a low friction contacting surface W. The layer 208 can for instance be made of metal foil and can be adhered to the cooling body 212, to a side facing the module 4, as shown. Alternatively, the layer 208 can be attached to other parts (not shown), so as to be stretched along said body 212. The cooling body 212 is adhered to a part of the housing 2 and is made of thermally conductive, compressible foam. The dimensioning of the cooling body 212 and sliding means 208 is such that the sliding means 208 extend at least partly in the insertion passage 206 formed on outer wall 202 for a module 4, so that upon insertion of such module 4, the sliding means 208 will be pushed aside by the passing module, in the direction of arrow P, thereby compressing the cooling body 212. To facilitate smooth insertion of the module 4, the edge R of the sliding means 208 facing the insert opening 206 may be rounded, as shown. To hold the inserted module 4 in clamped condition, an additional sliding means 208B may be provided at the opposite side of the module 4, for instance a plate-like member.

The invention is not in any way limited to the exemplary embodiments presented in the description and drawing. All combinations (of parts) of the embodiments shown and described are explicitly understood to be incorporated within this description and are explicitly understood to fall within the scope of the invention. Moreover, many variations are possible within the scope of the invention, as outlined by the claims.

The invention claimed is:

1. A cooling assembly for cooling a module in an electronic consumer appliance, said cooling assembly comprising:
    a cooling body; and
    a sliding means including a plurality of fingers configured to engage the module, the sliding means having a contact surface to form a thermally conductive bridge between the module and the cooling body,
    wherein the sliding means includes an upper plate and a lower plate, the upper and lower plates abutting each other in a first position, and the upper and lower plates being pushed apart by the module in a second position; and
    wherein the cooling body is configured to be positioned adjacent the upper plate or the lower plate to form the thermally conductive bridge.

2. The cooling assembly according to claim 1, wherein the cooling body is made of thermally conductive, compressible foam.

3. An electronic consumer appliance comprising: a cooling assembly for cooling a module of the electronic consumer appliance, the cooling assembly comprising:
    a cooling body; and
    a sliding means including a plurality of fingers configured to engage the module, the sliding means having a contact surface to form a thermally conductive bridge between the module and the cooling body,
    wherein the sliding means includes an upper plate and a lower plate, the upper and lower plates abutting each other in a first position, and the upper and lower plates being pushed apart by the module in a second position; and
    wherein the cooling body is configured to be positioned adjacent the upper plate or the lower plate to form the thermally conductive bridge.

4. The appliance according to claim 3, wherein at least one of the sliding means and the cooling body is mounted stationary within the appliance.

5. The appliance according to claim 3, wherein at least one of the sliding means and the cooling body is deflectable in a direction extending substantially perpendicular to an insert direction of the module.

6. The appliance according to claim 3, wherein the cooling body is made of compressible material or components.

7. The appliance according to claim 3, wherein the cooling body is made of thermally conductive foam.

8. The appliance according to claim 7, wherein the foam includes an elastomer filled with thermally conductive particles.

9. The appliance according to claim 3, wherein the plurality of fingers includes at least one spring member.

10. The appliance according to claim 3, wherein the plurality of fingers includes at least one plate spring.

11. The appliance according to claim 3, wherein the sliding means includes a layer of thermally conductive material, arranged so as to cover a side of the cooling body that in use faces the module to be cooled.

12. The appliance according to claim 3, wherein the sliding means is arranged to at least partly extend in a passage for the module, when there is no module inside, in order to close off said passage at least partly.

13. The appliance according to claim 3, wherein the cooling body rests against a housing of the appliance.

14. The appliance according to claim 3, wherein a plug-in arrangement is configured to receive the module.

* * * * *